United States Patent [19]

Pimbley et al.

[11] Patent Number: 4,613,882
[45] Date of Patent: Sep. 23, 1986

[54] HYBRID EXTENDED DRAIN CONCEPT FOR REDUCED HOT ELECTRON EFFECT

[75] Inventors: Joseph M. Pimbley; Gennady Gildenblat; Ching-Yeu Wei, all of Schenectady, N.Y.; Joseph Shappir, Jerusalem, Israel

[73] Assignee: General Electric Company, Schenectady, N.Y.

[21] Appl. No.: 722,642

[22] Filed: Apr. 12, 1985

[51] Int. Cl.[4] .................... H01L 29/78; H01L 29/06
[52] U.S. Cl. .................. 357/23.3; 357/23.12; 357/23.8; 357/23.9; 357/90; 357/20
[58] Field of Search ................. 357/23.3, 23.12, 23.8, 357/23.9, 90, 20

[56] References Cited

U.S. PATENT DOCUMENTS 3,936,857  2/1976  Ota ................................. 357/23.3
4,247,860  1/1981  Tihanyi ........................... 357/20
4,366,613  1/1983  Ogura et al. ..................... 357/23.9

OTHER PUBLICATIONS

Kiyoto Watabe, "LDD Structure Using Polysilicon on the Gate Sidewall", Presented at the 45th Japanese Applied Physics Conference, Oct. 12-15, 1984.
T. Wada, M. Nakamura, R. Dang and K. Taniguchi, "A Study of Hot-Carrier Degradation in Optimized 1 μm LDD-MOSFET Using Device Simulator", Presented at the 45th Japanese Applied Physics Conference, Oct. 12-15, 1984.
"Tighter VLSI Geometries Create Problems with Hot Carriers" by Charles L. Cohen, Electronics, Jul. 15, 1985, pp. 36-37.

Primary Examiner—Andrew J. James
Assistant Examiner—R. P. Limanek
Attorney, Agent, or Firm—Lawrence D. Cutter; James C. Davis, Jr.; Marvin Snyder

[57] ABSTRACT

Hot electron injection into the gate oxides of MOSFET devices imposes limitations on the miniaturization of such devices in VLSI circuits. A buried channel with a surface spacer is provided to guard against hot electron trapping effects while preserving process and structure compatibility with micron or submicron VLSI devices. The channel current is redirected into a buried channel at a distance away from the interface in the vicinity of the drain region where the hot electron effect is most likely to occur. Additionally, a surface implant is performed to improve any gate control that may be lost as a result of the buried channel so as to mitigate any degradation of the current-voltage characteristics of the device.

17 Claims, 2 Drawing Figures

HYBRID EXTENDED DRAIN CONCEPT FOR REDUCED HOT ELECTRON EFFECT

BACKGROUND OF THE INVENTION

The present invention relates to field effect transistor devices and more particularly, to such devices containing differentially doped surface and subsurface structures which provide reduced electric field strength levels at the interface boundary between the gate oxide and the semiconductor body.

One of the most useful and advantageous electrical devices is the field effect transistor (FET). Very large scale integrated (VLSI) circuits have been created using metal-oxide-semiconductor (MOS) field effect devices. These so-called MOSFET devices take their name from the structure of the device in the vicinity of the gate. The gate electrode typically comprises a metal layer insulated by a silicon oxide layer from a doped semiconductor layer beneath the oxide. In the present invention, the problem addressed is the trapping of hot or energetic electrons in the gate oxide region, particularly in those regions adjacent to the device drain.

Decreased cost and improved performance provide an impetus for miniaturizing metal oxide semiconductor devices even further. Continuing advances in lithography and etching will permit even greater reductions in device size. Unfortunately, for reasons such as the compatibility with existing systems, the power supply voltages used in such devices usually fails to decrease with increasing circuit density. As a result of this violation of ideal scaling, electric field strength levels within the device increase as geometric distances shrink. High field effects within MOS devices include carrier mobility reduction and channel hot electron instability in MOSFETs, particularly n-channel MOSFETS or, NMOSFETs. Electrons flowing from the source to drain regions of an n-channel FET gain energy from the lateral electric field component. This component of electric field is parallel to the interface between the silicon semiconductor and the silicon oxide insulating layer beneath the gate electrode. Energetic electrons tend to surmount the silicon/silicon-oxide energy barrier and are trapped within the oxide gate insulator or generate undesirable interface states by mechanisms which are not yet fully understood.

Hot or energetic electrons from the channel current have a tendency to acquire sufficient energy to surmount the barrier between the semiconductor and the gate oxide and as a result, are injected into the oxide. Subsequent trapping of the injected electrons tends to cause device instabilities such as threshold-voltage shift and transconductance degradation. Accordingly, it is highly desirable that hot-electron resistant MOSFETs be devised to prevent such instabilities. These instabilities impose undesirably severe limitations on the further miniaturization of MOSFET devices in VLSI circuits.

While improvements in hot electron effect problems can be partially effected by increasing the thickness of the gate oxide, this is an undesirable option because it reduces gate control effects and results in slower operating devices.

It is seen that the hot electron problem is certainly undesirable and may eventually limit the minimum gate length for MOSFETs. Although improving the insulator quality with respect to hot electron trapping effects may be possible, most efforts at improving channel hot electron reliability have focused on reducing the lateral electric field strength within the FET channel. Such attempts include graded source/drain junctions, double-diffused source/drain regions, and an oxide sidewall spacer adjacent to the gate electrode and oxide. All of these methods reduce the lateral field strength by making the $n^+$-p drain-channel transition less abrupt. The instant inventors have found that the oxide sidewall spacer can increase the maximum safe operating voltage by as much as 2 volts. A maximum gain of 1.5 volts per 1,000 angstroms of spacer length is possible. It is additionally noted that any method or structure which is directed at relieving the hot electron effect problem should also be compatible with present VLSI semiconductor processing steps.

SUMMARY OF THE INVENTION

In accordance with a preferred embodiment of the present invention, a buried spacer and a surface spacer are employed together so as to move high density current flow away from the silicon/silicon-oxide interface boundary without significant adverse current-voltage effects. In particular, a lightly doped buried n-type region is developed by ion implantation in source or drain regions (preferably both) on either side of the gate electrode by means of a high voltage field. This n-doped region lies below and spaced apart from the silicon/silicon-oxide boundary. This n-doped region is formed by implantation at high voltage. A second, light or low concentration $\bar{n}^-$-dopant such as arsenic, is also implanted, but at the surface of the device. This additional surface implant provides better gate control and improves the current-voltage characteristics of the device. Silicon oxide spacers on either side of the gate electrode are then formed by a process such as reactive ion etching, which is anisotropic. A third ion implantation operation is then performed at an increased dopant concentration, but at a lower ion implant field strength. However, the higher dopant concentrations result in deeper semiconductor penetration. As a result of this process, more lightly doped n and $n^-$ regions extend from the source and drain at and beneath the semiconductor surface. It is between the deeper source and drain extensions that higher current density most likely occurs. This results in a reduction of hot electron production in the vicinity of the gate electrode with reduced negative impact on device current-voltage characteristics. Nonetheless, the lateral electric field strength, particularly the field strength immediately beneath the gate oxide, is significantly reduced.

Accordingly, it is an object of the present invention to provide a method for the manufacture of MOSFET devices exhibiting greater immunity to hot electron effects.

It is also an object of the present invention to provide improved NMOSFET manufacturing processes.

It is yet another object of the present invention to provide a means for reducing the lateral electric field strength beneath the gate oxide in a MOSFET device without significantly affecting current-voltage characteristics for the device.

It is a still further object of the present invention to provide a method for decreasing MOSFET circuit size without exacerbating hot electron effects.

Lastly, but not limited hereto, it is an object of the present invention to provide MOSFET, and in particular NMOSFET devices, in which hot electron effects are significantly mitigated.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
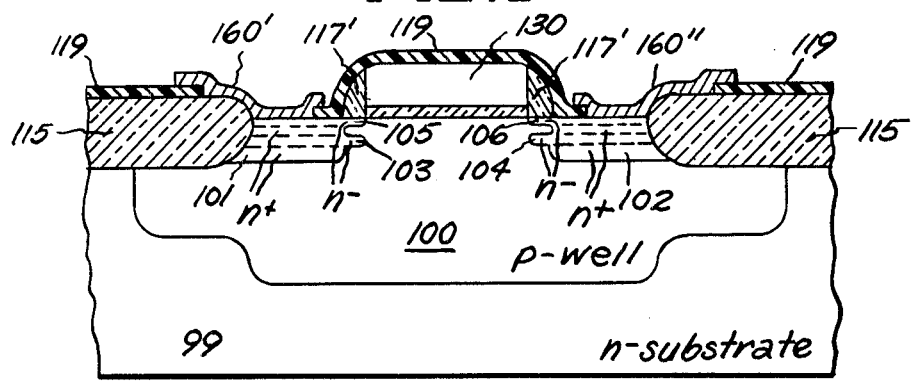
FIG. 1 is a cross-sectional side elevation view of a MOSFET device produced in accordance with the present invention.

FIG. 1 illustrates an NMOSFET device in accordance with the present invention. Except for the specific processing employed to carry out the purposes of the present invention, device fabrication is accomplished in a conventional fashion. FIG. 1 particularly indicates underlying n-doped substrate 99. In accordance with conventional processes, field oxide layer 115 is grown on substrate 99 by exposing the substrate to oxygen at a high temperature, so as to form an insulating layer of silicon oxide 115. This layer is etched in a patterned fashion so as to define active areas on the chip or wafer. P-doped well 100 is typically thereafter formed by ion implantation through the active area openings in the field oxide. A thin silicon oxide layer is then grown over the entire substrate. This oxide layer ultimately forms gate oxide 116 which comprises the structure which is subject to the hot electron trapping effect discussed above. Over this thin oxide layer, a layer of polycrystalline silicon is deposited and heavily doped with an n-type dopant so as to provide a material exhibiting high electrical conductivity. This layer eventually forms gate electrode 130. Alternatively, metal rather than doped polycrystalline silicon may be employed for the gate electrode material. In any event, at this stage in the process, a mask is generally employed to produce gate electrode and electrode interconnection patterns where desired. These patterns are created by selective removal of the polycrystalline silicon or metal gate electrode material which typically leaves a thin oxide layer in the active area.

At this stage in the semiconductor manufacturing process, special process steps are employed to effect the formation of the structure illustrated in FIG. 1. More particularly, at this point in the process, a light concentration of n-type dopant such as arsenic is deposited in a buried layer. This deposition occurs by means of ion implantation at a voltage of approximately 200 keV. This results in the formation of lightly doped n-regions 103 and 104 (between the dotted lines) at a depth of approximately 1,000 angstroms below the silicon/oxide interface. Doped n-regions 103 and 104 extend inwardly toward the gate region to form the protrusions shown. It is these protrusions which provide for reduced hot electron trapping effects in the buried channel device herein. In accordance with the present invention, a second doping is performed at a reduced potential. Thus, n⁻-regions 105 and 106 are formed by doping with a light concentration of dopant such as arsenic. It should be noted that regions 103, 104, 105, and 106 extend from field oxide 115 inwardly to the left and right edges of gate electrode 130. This doping is performed at an implant dosage of between approximately $10^{12}$ and $10^{14}$ dopant atoms per square centimeter of source of drain region. In contrast, prior art doping process steps are carried out at much lower implantation voltages and do not produce the graded, buried spacer structures shown in FIG. 1. It is noted that regions 103 and 104 may be formed before or after regions 105 and 106, but that is possible to perform the deeper implant first.

At this stage of the process, another silicon oxide layer is deposited on the surface of the wafer or chip. However, in contrast to other methods for depositing an oxide layer, in this process step chemical vapor deposition is typically employed since it is desired to cover the entire surface of the device. A reactive ion etching step is then carried out, typically in an atmosphere of trifluoromethane ($CHF_3$) to anisotropically etch away most of this silicon layer except in those areas exhibiting sharp vertical transitions such as on either side of gate electrode 130. The anisotropic etching is advantageous in that it leaves oxide spacers 117' on either side of gate electrodes 130. These spacers provide an important function in mitigating the effects of hot electrons generated near the oxide/semiconductor interface below the gate and more particularly in the vicinity between the gate the device drain. Additionally, spacers 117' also provide a form of self aligned mask for the next process step which is the ion implantation or diffusion of the source and drain regions. In accordance with the present invention, a heavier, n+, doping is applied to the source and drain source regions of the active area. Typically, this second doping process step is performed at an implant dosage of about $8 \times 10^{15}$ dopant atoms per square centimeter. This results in the formation of regions 101 and 102 in FIG. 1, these regions typically extending to a depth of between about 1,500 and 4,000 angstroms. Because of the masking effect produced by spacers 117', only a small n and n⁻ doped region of the source and drain are left to extend inwardly from regions 101 and 102. These are the protrusions which form a part of layers 103, 104, 105, and 106 as shown. Typically each gate side spacer 117' is between about 0.1 and 0.2 microns in width. Accordingly, the more lightly doped source and drain protrusions extend inwardly toward the gate for a corresponding distance of between approximately 0.1 and 0.2 microns.

In accordance with the present invention, it is also possible to employ gate spacers 117' which comprise polysilicon material. In this embodiment, lightly doped regions 103, 104, 105, and 106 can be implanted at more conventional voltage levels, say for example, 90 keV. In this embodiment, buried channels are formed as the doped polysilicon or metal spacer is biased to a positive voltage via a doped polysilicon gate. In the event that it is desired to employ doped polycrystalline silicon spacers, reactive ion etching is employed to effect removal of the polycrystalline silicon material in the gate masking portion of the process.

In the present invention, regions 105 and 106 are lightly doped, preferably with a dopant such as arsenic at an implant dosage of between approximately $10^{12}$ to $10^{14}$ dopant atoms per square centimeter. The dopant implant dosage in regions 103 and 104 is slightly higher, being between approximately between $10^{13}$ to $10^{14}$ dopant atoms per square centimeter. It is noted, however, that these implant dosages produce dopant concentrations in these regions prior to the heavy dopant implant n+ in source region 101 and drain region 102. Nonetheless, the lighter dopant concentrations are preserved in the portions of the source and drain which protrude and extend toward one another, as a result of the shielding effect provided by shoulders spacers 117′. The heavier, n+ dopant implant dosage is typically about $8 \times 10^{15}$ dopant atoms per square centimeter.

Figure 2:
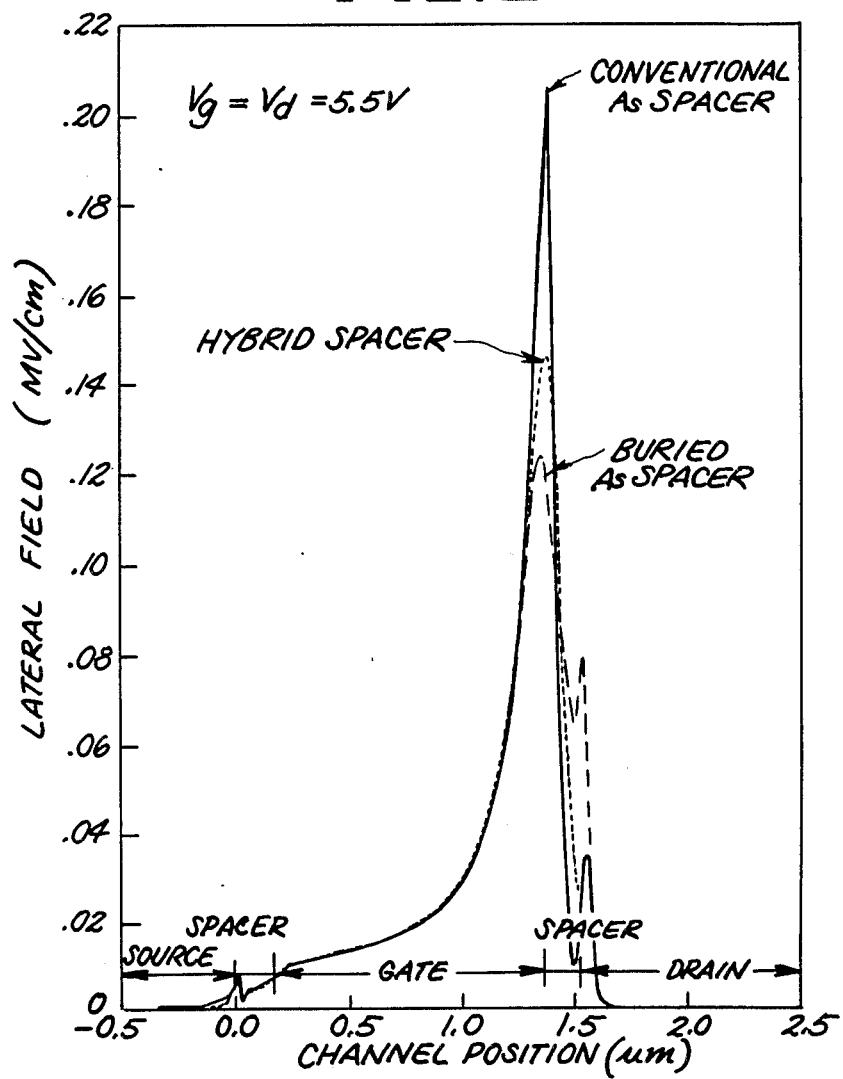
FIG. 2 is a plot of lateral electric field strength versus channel position for several MOSFET structures.

FIG. 2 illustrates the relative improvement in the lateral electrical field in the gate region achieved by various subsurface spacer configurations. In particular, FIG. 2 illustrates computer simulated variation in electrical field strength as a function of channel position. The electrical field strength is measured in megavolts per centimeter and the channel position is given in microns. FIG. 2 also indicates the various device regions across the gate region of the semiconductor material in a MOSFET device. More particularly, FIG. 2 illustrates the variation from the source to the drain region through the gate region and includes spacers on either side of the gate electrode. In all cases shown, the source-to-drain voltage, and the source-to-gate voltage was fixed at 5.5 volts. In the event that conventional arsenic-doped spacers are employed at the surface of the semiconductor substrate, it is seen that the lateral field reaches a peak of approximately 0.21 megavolts per centimeter in the vicinity between the gate and the drain. If the hybrid spacer structure of the present invention is employed, it is seen that the peak simulated electric field strength is reduced to approximately 0.15 megavolts per centimeter. However, in the structure in which only buried spacers are present, it is seen that a maximum lateral electric field strength of only approximately 0.12 megavolts per centimeter is produced. However, this device is somewhat lacking in gate control capabilities. These capabilities are restored by the structure of the present invention. In any event, the reduction in lateral electric field strength is greatly desired for controlling the hot electron effect.

Accordingly, it is seen from the above that the methods and structure of the present invention provide a viable solution to the problem of hot electron entrapment in the oxide layer of a MOSFET device. It is also seen that the present invention provides a simplified process for producing the desired structural implant modifications without departing from conventional processing methodologies. It is also seen that the present invention permits the shrinkage of MOSFET circuits to densities which are even greater than those currently achievable without the necessity of scaling down supply voltages. Accordingly, devices manufactured in accordance with the present invention are much more readily incorporated in currently existing systems. It is also seen that the devices of the present invention are much better able to undergo voltage stress without significant device characteristic impairment. It is additionally noted that, while it is generally preferred that both the source and drain regions possess the buried channel structure of the present invention, it is possible to employ such a structure in only one of these regions. However, in transistors in which current flow is unidirectional, it is generally preferred to employ such structures only in the drain region.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A metal oxide semiconductor field effect transistor comprising:

a semiconductor body doped with a first polarity dopant;

an insulating layer disposed over a portion of said body; and an electrically conductive gate electrode disposed over said insulating layer so as to be electrically insulated from said semiconductor body;

said semiconductor body having a source region heavily doped with a second polarity dopant and a drain region heavily doped with said second polarity dopant, said source and drain regions being disposed in said semiconductor body to a specified depth on either side of said gate electrode; and said semiconductor body having a first lightly doped protrusion extending from at least one of said source and said drain regions, said dopant in said first protrusion being a second polarity dopant, each said first protrusion being disposed beneath the surface of said semiconductor body and extending toward the region beneath said gate electrode, each said first protrusion being spaced apart from the boundary between said semiconductor body and said insulating layer;

said semiconductor body also having a second lightly doped protrusion extending from at least one of said source and said drain regions, said dopant in said second protrusion being a second polarity dopant, each said second protrusion being disposed adjacent to the surface of said semiconductor body and extending toward the region beneath said gate electrode and spaced apart from said first protrusion there being at least three of said protrusions.

2. The transistor of claim 1 further including side spacers on either side of said gate electrode.

3. The transistor of claim 2 in which said spacers are between approximately 0.1 and 0.2 microns in width.

4. The device of claim 1 in which said lightly doped protrusions extend outwardly from adjacent heavily doped regions for a distance of between approximately 0.1 and 0.2 microns.

5. The transistor of claim 1 in which each said first lightly doped protrusion is disposed approximately 1,000 angstroms below the interface between said oxide and said semiconductor body.

6. The transistor of claim 1 in which said heavily doped regions extend approximately from the surface of said semiconductor body to a depth of between approximately 1,500 and 4,000 angstroms therein.

7. The transistor of claim 1 in which said first polarity dopant comprises a p-type dopant and said second type dopant comprises an n-type dopant.

8. The transistor of claim 1 in which said transistor is an n-channel device.

9. The transistor of claim 1 in which said first light dopant comprises arsenic.

10. The transistor of claim 1 in which said second light dopant comprises arsenic.

11. The transistor of claim 1 in which said semiconductor body comprises silicon.

12. The transistor of claim 1 in which said said semiconductor body comprises an n-doped semiconductor substrate including a p-doped well therein.

13. The transistor of claim 1 in which said insulating layer comprises silicon oxide.

14. The transistor of claim 1 in which said electrically conductive gate comprises material selected from the group consisting of metals and doped polycrystalline silicon.

15. The transistor of claim 1 in which said heavily doped region is formed at an implant dosage of approximately $8 \times 10^{15}$ atoms of dopant per square centimeter.

16. The transistor of claim 1 in which each said first lightly doped protrusions is formed at an implant dosage of between approximately $10^{12}$ and $10^{14}$ dopant atoms per square centimeter.

17. The transistor of claim 1 in which each said second lightly doped protrusion is formed at an implant dosage of between approximately $10^{12}$ and $10^{14}$ dopant atoms per square centimeter.

* * * * *